United States Patent
Fensore et al.

(10) Patent No.: US 7,683,673 B2
(45) Date of Patent: Mar. 23, 2010

(54) STACKED DIFFERENTIAL SIGNAL TRANSMISSION CIRCUITRY

(75) Inventors: David J. Fensore, New Gloucester, ME (US); Alexander A. Alexeyev, Gorham, ME (US)

(73) Assignee: National Semiconductor Corporation, Santa Clara, CA (US)

( * ) Notice: Subject to any disclaimer, the term of this patent is extended or adjusted under 35 U.S.C. 154(b) by 189 days.

(21) Appl. No.: 11/753,163

(22) Filed: May 24, 2007

(65) Prior Publication Data

US 2008/0266463 A1 Oct. 30, 2008

Related U.S. Application Data

(60) Provisional application No. 60/913,622, filed on Apr. 24, 2007.

(51) Int. Cl.
*H03K 19/0175* (2006.01)
(52) U.S. Cl. .................... 326/86; 326/127; 327/210
(58) Field of Classification Search .............. 326/121, 326/127, 112, 115; 327/108, 266, 274, 280, 327/287
See application file for complete search history.

(56) References Cited

U.S. PATENT DOCUMENTS

| 5,202,618 | A | | 4/1993 | Nishimura |
| 6,025,742 | A | * | 2/2000 | Chan ............................ 327/108 |
| 6,380,797 | B1 | * | 4/2002 | Macaluso et al. ............ 327/513 |
| 6,600,346 | B1 | * | 7/2003 | Macaluso ..................... 327/108 |
| 6,970,043 | B2 | * | 11/2005 | Pradhan et al. .............. 330/253 |
| 7,012,450 | B1 | * | 3/2006 | Oner et al. ..................... 326/86 |
| 7,408,995 | B2 | * | 8/2008 | Segaram ...................... 375/257 |
| 7,501,859 | B1 | * | 3/2009 | Ohannes ....................... 326/82 |
| 2003/0067337 | A1 | * | 4/2003 | Yin et al. ..................... 327/210 |
| 2003/0151431 | A1 | * | 8/2003 | Morgan et al. .............. 327/108 |
| 2003/0151438 | A1 | * | 8/2003 | Lye ............................. 327/237 |

FOREIGN PATENT DOCUMENTS

| DE | 601 06 541 T2 | 10/2005 |
| EP | 1 184 986 B1 | 10/2004 |

OTHER PUBLICATIONS

Binkley, Jeb, et al., "Architecture and Implementation of a Low-Power LVDS Output Buffer for High-Speed Applications", IEEE, vol.53, No. 10, Oct. 2006, pp. 2101-2108.
Kim, Doo-Hwan, et al., "Dual-Level LVDS Technique for Reducing the Data Tranmission Lines by Half of LCD Driver IC", IEEE, 2004, pp. 319-322.
Chen, Mingdeng, et al., "Low-Voltage Low-Power LVDS Drivers", IEEE, vol. 40, No. 2, Feb. 2005, pp. 472-479.
U.S. Appl. No. 11/778,312, entitled Termination Compensation for Differential Signals on Glass, filed Jul. 16, 2007, 26 pages.
European Search Report for German Patent Application No. 10 2008 020 369.6 dated Dec. 17, 2008, 3 pp.

* cited by examiner

*Primary Examiner*—Vibol Tan
(74) *Attorney, Agent, or Firm*—Vedder Price P.C.

(57) ABSTRACT

Differential signal transmission circuitry in which multiple differential signal transmission circuits are coupled in a stacked relationship between the power supply electrodes to minimize power dissipation by reusing the signal currents among the channels.

16 Claims, 11 Drawing Sheets

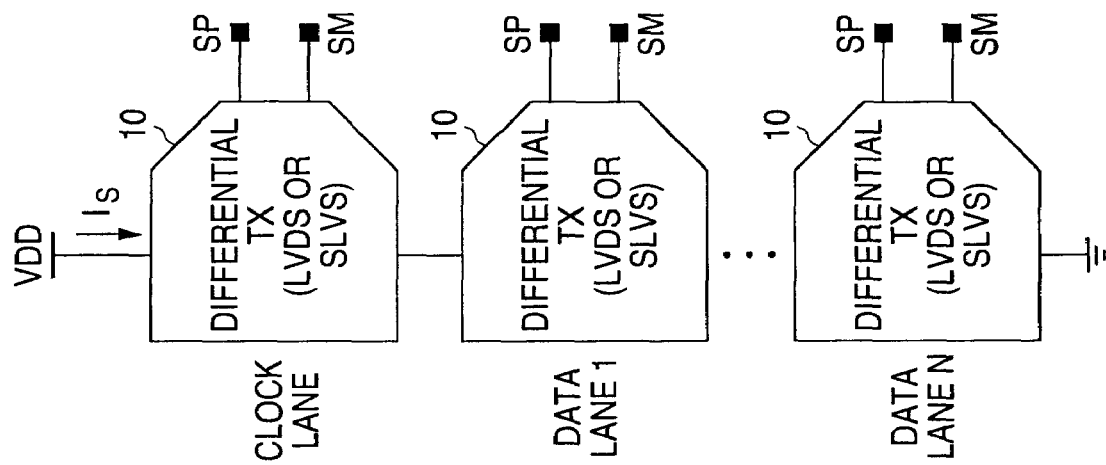
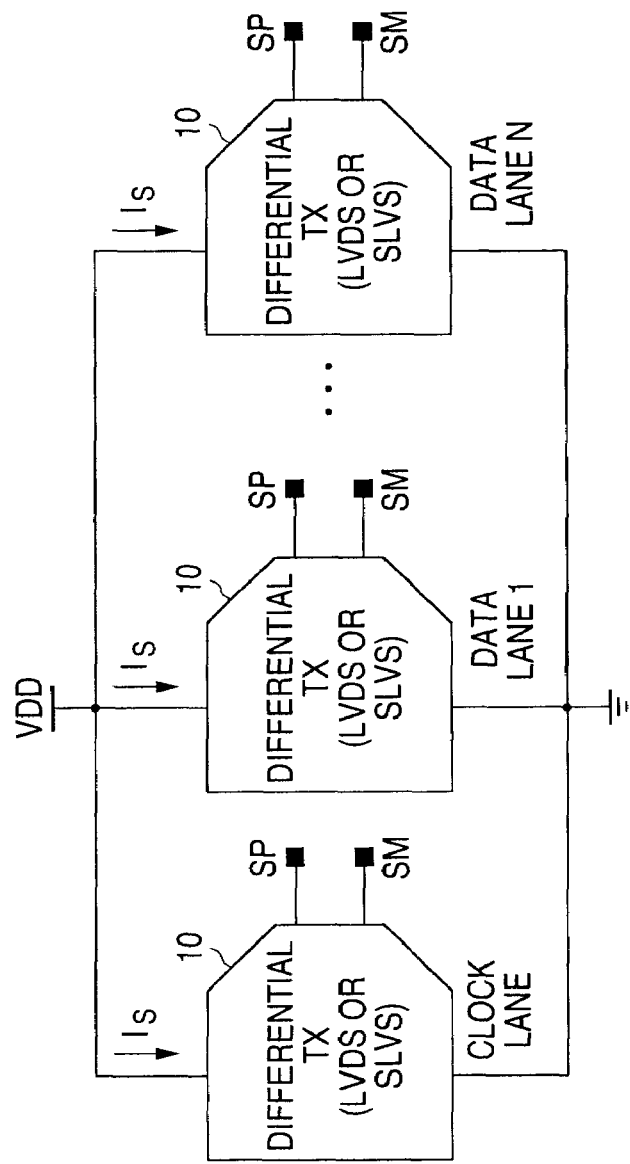
FIG. 3B
FIG. 3A
(PRIOR ART)

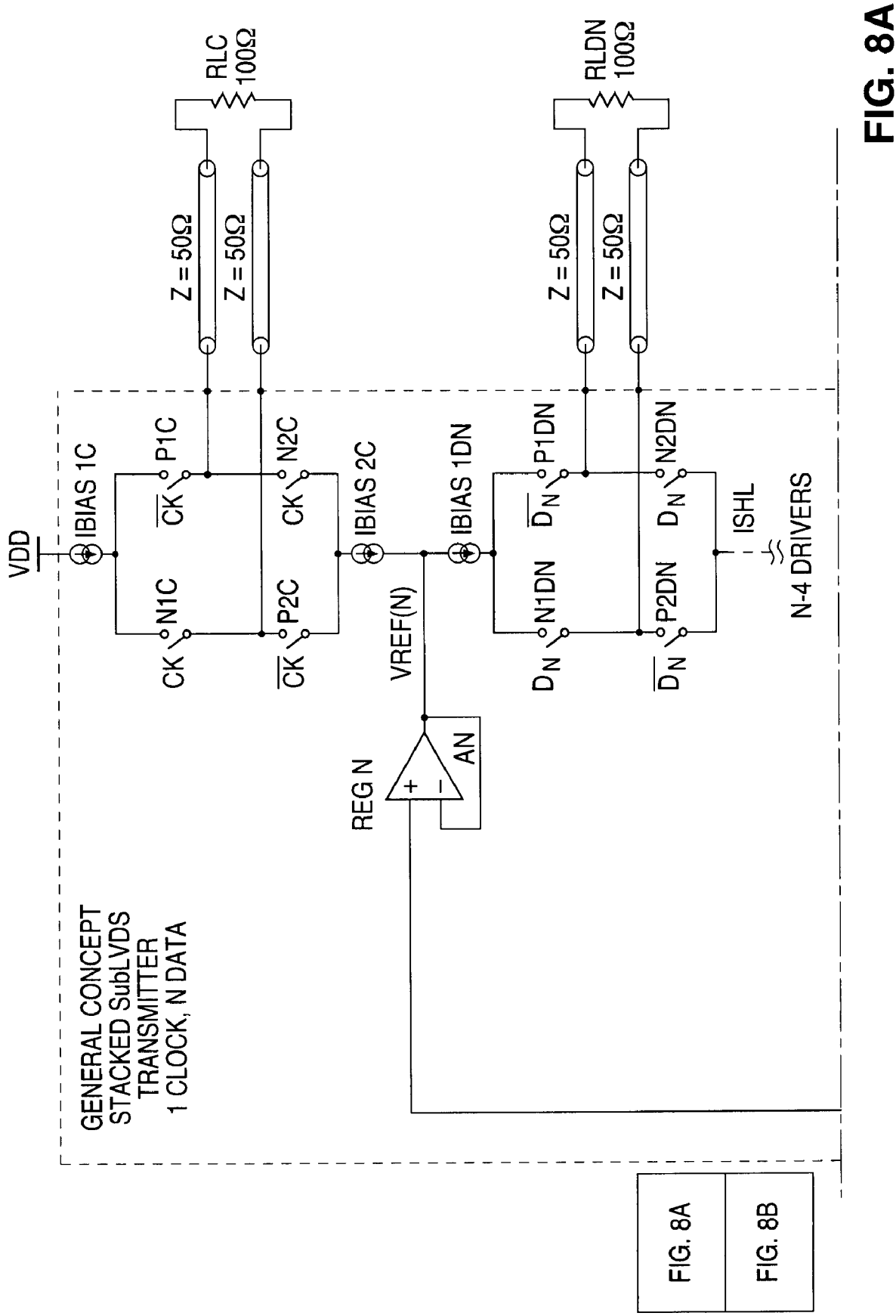

STACKED DIFFERENTIAL SIGNAL TRANSMISSION CIRCUITRY

RELATED APPLICATIONS

This applications claims priority from U.S. Provisional Patent Application No. 60/913,622, filed on Apr. 24, 2007, the disclosure of which is incorporated herein by reference.

BACKGROUND OF THE INVENTION

1. Field of the Invention

The present invention relates to differential signal interfaces, and in particular, to low voltage differential signal transmitters for operating with low power dissipation.

2. Related Art

Differential input/output (I/O) signal interfaces are widely used for reliable high speed data transfer in many forms of data communication channels. They are used in both source synchronous and asynchronous communication systems. They can be used with bandwidth extension techniques, such as equalization and pre-emphasis. As is well known, differential signaling is preferred to single ended signaling due to its highly robust resistance to common mode noise associated with both conducted and radiated electromagnetic interference (EMI), as well as lower power dissipation compared to single ended static complementary metal oxide semiconductor (CMOS) implementations. Further, differential signaling also produces lower EMI emissions then their single ended counterparts due to reduced signal magnitudes and switching currents.

Referring to FIG. 1, a typical low voltage differential signal (LVDS) transmission circuit 10a includes switching transistors N1, P1, P2, N2 biased by an upper current source IBIAS1 and lower current source IBIAS2, all interconnected substantially as shown and biased by a power supply voltage VDD. (Throughout the following discussion, switching devices N1, P1, P2 and N2 are referred to as "transistors" since such devices are often implemented as pass transistors, with N1 and N2 are being N-type CMOS field effect transistors (CMOSFETs), and P1 and P2 being P-type CMOSFETs. However, as will be readily understood, as an alternative, the switching devices N1, P1, P2, N2 be either all N-type or all P-type transistors. Further, as yet another alternative, each of the switching devices N1, P1, P2, N2 can be implemented as a pair of complementary transistors, i.e., an N-type and a P-type together, coupled in parallel in what is known as a transmission gate.) Transistors N1 and N2 are turned on by the positive phase D of the differential data signal, while transistors P1 and P2 are turned on by the negative phase /D of the differential data signal. The differential output signal is conveyed via transmission lines (e.g., having a characteristics impedance of 50 ohms) which are terminated by a load resistance RL (e.g., typically having a real impedance of 100 ohms). Additionally, many implementations include an internal, or source, resistive termination RS (e.g., having a real impedance of 100 ohms).

One disadvantage of such a transmission circuit 10a is relatively high signal power consumption, particularly when the source termination RS is included. For example, a typical signal link biased with a 2 mA current source for a differential termination of 100 ohms with no source termination will require a 4 mA current source when using a source termination (for each clock and data channel in a source synchronous implementation).

Many applications do not require the source termination RS, depending upon the required bandwidth and channel quality. However, with increasing data rates and wider adoption of differential I/O technology by consumer electronics manufactures with lower quality communications media due to lower cost implementations (e.g., as compared to industrial and commercial applications) source terminations have become virtually essential. Additionally, the low impendence provided by a source termination improves EMI immunity of the signal interface, since it limits the amount of radiated EMI that can couple into the interface and introduce communication errors. This can be especially important for mobile and handheld applications where EMI immunity is generally of even greater concern.

Referring to FIG. 2, this problem of higher power dissipation in a source terminated LVDS signal link has been addressed with a design proposed by JEDEC (Joint Electron Device Engineering Counsel), which is similar to a static CMOS signal driver with a fixed output impedance of 50 ohms operating on an internally regulated low power supply voltage of 800 mV. The result is this scalable low voltage serial (SLVS) signal link with separate source termination resistances RS1, RS2. Such a design provides power dissipation similar to that of a LVDS signal link without source termination. Scalability is provided in that the power consumption can be further reduced if the internal regulated power supply can be scaled down to 400 mV to reduce the output signal magnitude to 200 mV and signaling current to 2 mA, with further reductions also possible.

However, 4 mA or even 2 mA, per channel, of signaling current results in power dissipation that can still be sufficiently high to make a differential I/O signal interface inefficient for battery-operated applications. Accordingly, additional techniques have been proposed to further reduce power dissipation of a differential I/O signal interface. In one technique, a separate clock channel is made unnecessary by having the clock share one of the data channels or bandwidth, e.g., using clock data recovery (CDR) or other clock embedding techniques. Another technique requires further reduction in the voltage amplitude of the transmitted signal, thereby further reducing the signaling current.

While embedding the clock within a data channel can reduce power dissipation, a phase lock loop (PLL) in the receiver then becomes necessary. Further, the time necessary to acquire and recover the embedded clock signal within the data stream can be long compared to the desired data rate. Moreover, data channel encryption is typically needed to assist the clock data recovery. As a result, with the requirement of a PLL, power dissipation becomes similar to that required by a system using a dedicated clock channel. Meanwhile, a source synchronous link can be powered up quickly with synchronization across the channel established in a simple and reliable manner, with problems arising only at very high data rates (e.g., higher than 3 GB/s per channel) when the skew between the clock and data channels begins to dominate the timing budget of the communications link. Hence, virtually the only advantage of the CDR embedded clock technique is the reduced number of physical connections needed to implement the interface. However, with a sufficient degree of serialization, the difference of an additional two connections to transmit a clock across the link is well within the cost budget for a typical consumer device.

Other than CDR, other techniques have been proposed in which the clock is embedded within the data stream via a logical operation on data channels or some form of pulse with modulation (PWM) of the transmitted signal. However, these techniques often increase complexity of the interface and reduce available bandwidth.

Reducing the signal magnitude, i.e., the voltage swing, can be effective in reducing power dissipation in a differential signal interface. As noted, a conventional LVDS voltage swing is 400 mV, resulting in 4 mA of signal current with no source termination, and 8 mA with source termination. By reducing the voltage swing to 200 mV, these signal currents are reduced to 2 mA and 4 mA, respectively. There have been reports of signal interfaces operating with a 100 mV signal swing, with signal current reduced to 1 mA per channel. However, this results in a reduced signal to noise ratio (SNR) for the interface, thereby producing less reliable operation in the presence of noise. Accordingly, it appears that source termination will be required for a LVDS implementation of a differential I/O link if it is desired to reduce the signal swing to or below 100 mV. As a result, it appears that signal current per channel in such an interface for reliable operation has a minimum of approximately 2 mA. Further, reducing the signal voltage swing causes the performance requirements of the receiver to be increased, since it will now have to distinguish between smaller input differential signals in the presence of voltage offsets, both systematic and random. As a result, offset compensation circuitry may be needed, thereby again increasing circuit complexity.

Accordingly, it would be desirable to have a differential I/O signal interface with reduced power dissipation per channel, low circuit complexity, no inherent bandwidth restrictions, operable without data or clock encoding, operable without imposing additional requirements on the signal receiver, and highly robust resistance to EMI and other noise sources.

SUMMARY OF THE INVENTION

In accordance with the presently claimed invention, differential signal transmission circuitry is provided in which multiple differential signal transmission circuits are coupled in a stacked relationship between the power supply electrodes to minimize power dissipation by reusing the signal currents among the channels.

In accordance with one embodiment of the presently claimed invention, differential signal transmission circuitry with a plurality of stacked differential signal transmitters includes:

first and second power supply electrodes to provide first and second voltages;

a plurality of differential signal transmission circuits coupled between the first and second power supply electrodes;

one or more inner biasing circuits coupled among the plurality of differential signal transmission circuits;

voltage regulation circuitry, coupled to at least one of the first and second power supply electrodes and to the one or more inner biasing circuits, to provide one or more regulator voltages having one or more successive values intermediate the first and second voltages;

wherein the plurality of differential signal transmission circuits and the one or more inner biasing circuits are coupled in a stacked alternating relationship with a respective one of the one or more inner biasing circuits coupled between successive ones of the plurality of differential signal transmission circuits, and each one of the one or more inner biasing circuits is coupled to the voltage regulation circuitry to receive at least one respective one of the one or more regulator voltages.

In accordance with another embodiment of the presently claimed invention, differential signal transmission circuitry with a plurality of stacked differential signal transmitters includes:

first and second power supply electrodes to provide first and second voltages;

one or more shared electrodes;

a plurality of low voltage differential signal (LVDS) transmission circuits coupled via the one or more shared electrodes in a stacked relationship between the first and second power supply electrodes; and voltage regulation circuitry, coupled to at least one of the first and second power supply electrodes and to the one or more shared electrodes, to provide one or more regulator voltages having one or more successive values intermediate the first and second voltages.

In accordance with another embodiment of the presently claimed invention, differential signal transmission circuitry with a plurality of stacked differential signal transmitters includes:

first and second power supply electrodes to provide first and second voltages;

a plurality of scalable low voltage serial (SLVS) transmission circuits coupled in a stacked relationship between the first and second power supply electrodes; and voltage regulation circuitry, coupled to at least one of the first and second power supply electrodes and to the one or more shared electrodes, to provide one or more regulator voltages having one or more successive values intermediate the first and second voltages.

BRIEF DESCRIPTION OF THE DRAWINGS

FIG. 3A is a block diagram of a conventional multi-channel differential signaling system.

FIG. 3B is a block diagram of a differential signaling system in accordance with one embodiment of the presently claimed invention.

DETAILED DESCRIPTION

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together (e.g., as one or more integrated circuit chips) to provide the described function. Additionally, the term "signal" may refer to one or more currents, one or more voltages, or a data signal. Within the drawings, like or related elements will have like or related alpha, numeric or alphanumeric designators. Further, while the present invention has been discussed in the context of implementations using discrete electronic circuitry (preferably in the form of one or more integrated circuit chips), the functions of any part of such circuitry may alternatively be implemented using one or more appropriately programmed processors, depending upon the signal frequencies or data rates to be processed.

Referring to FIGS. 3A and 3B, the stacked arrangement of circuitry in accordance with one embodiment of the presently claimed invention (FIG. 3B) can be readily seen, as opposed to the parallel arrangement of conventional circuitry (FIG. 3A). As discussed in more detail below, this arrangement allows the signaling current to be reused among the individual transmission circuits 10.

Figure 1:
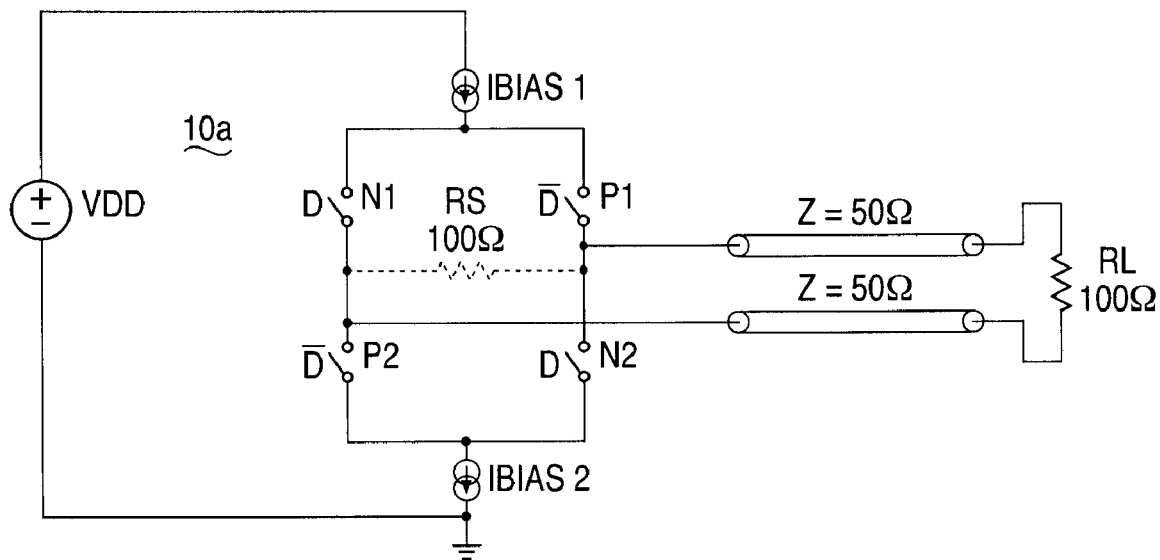
FIG. 1 is a schematic diagram of a conventional LVDS transmission circuit.
Figure 2:
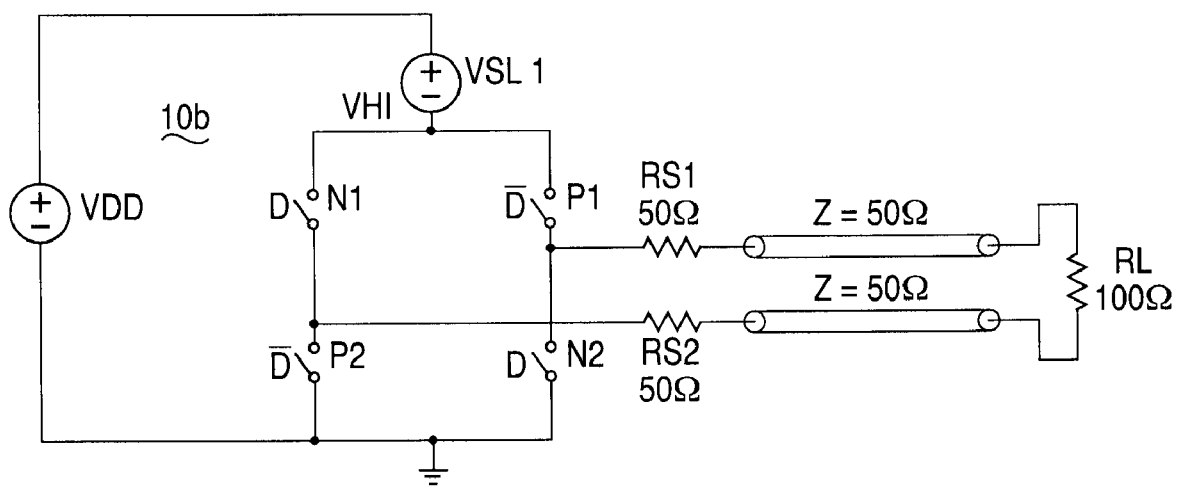
FIG. 2 is a schematic diagram of a conventional SLVS transmission circuit.
Figure 4:
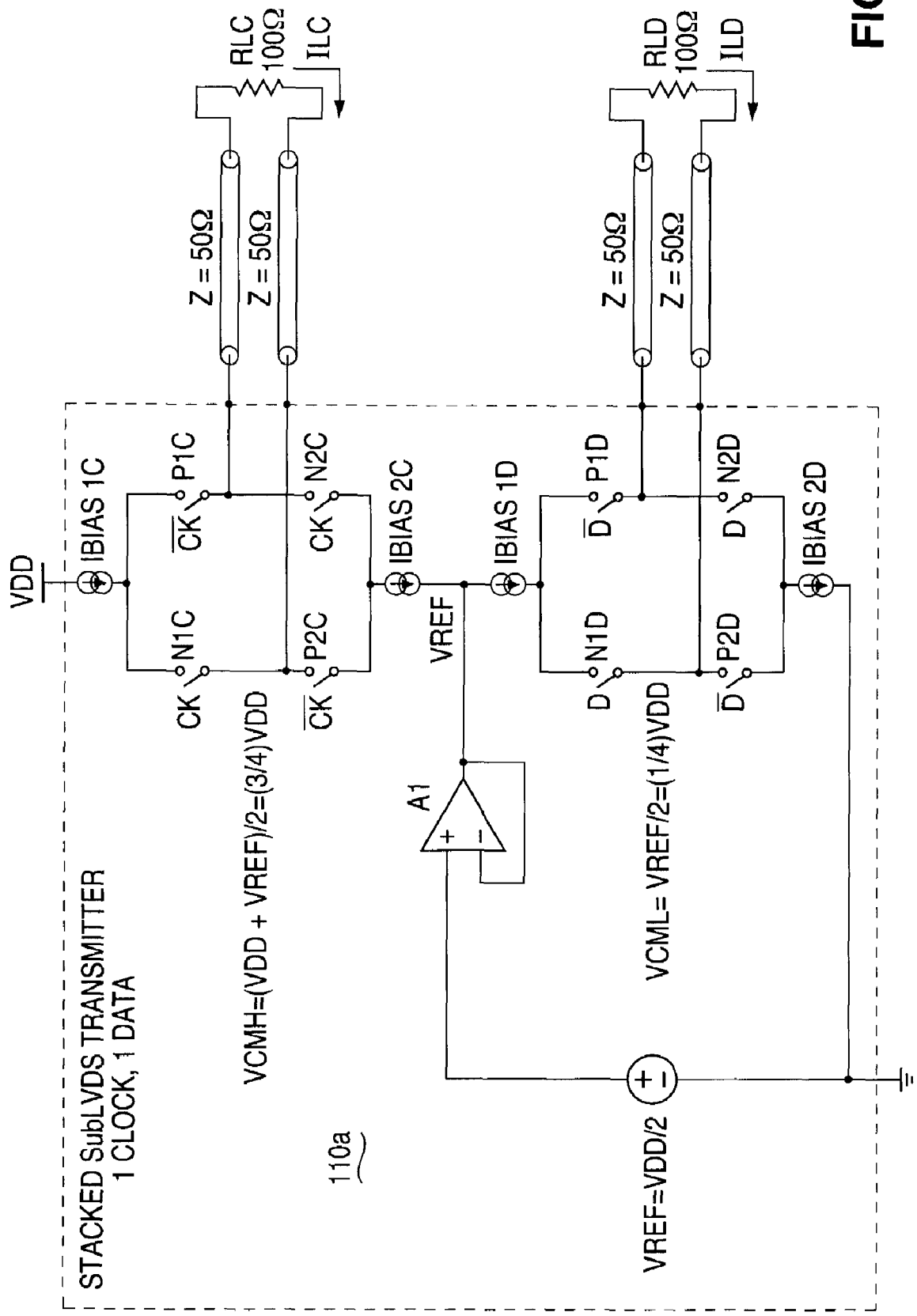
FIG. 4 is a schematic diagram of a stacked LVDS implementation of a differential signaling system in accordance with one embodiment of the presently claimed invention.

Referring to FIG. 4, general operation of the presently claimed invention, can be demonstrated using a simplified implementation 110a with one clock channel and one data channel. The differential transmitter for the data channel, in this example, is at the bottom of the stack and referenced to circuit ground (e.g., the lower power supply electrode VSS of a typical power supply for CMOS circuits). The differential transmitter for the clock channel is at the top of the stack and connected to the upper power supply terminal VDD. In accordance with well known LVDS circuit principles, each of the differential transmitters is biased by balanced current sources IBIAS1, IBIAS2 to provide the current to be channeled through the termination RL in accordance with the switches controlled by the differential phases of the clock CK, /CK and data D, /D signals.

Additional circuitry needed is a low output impedance, wide bandwidth voltage regulator to provide a low impedance node in the form of an internal pseudo power supply rail for the bottom connection of the upper transmitter, i.e., at the lower connection of its lower current source IBIAS2C, and at the top connection of the lower transmitter, i.e., at the upper connection of its upper current source IBIAS1D. The introduction of this low impendence node keeps the stacked transmitters independent of each other, while the wide bandwidth regulator helps to minimize intersymbol interference (ISI) by supplying the fast AC currents needed during signal switching transitions.

Figure 5:
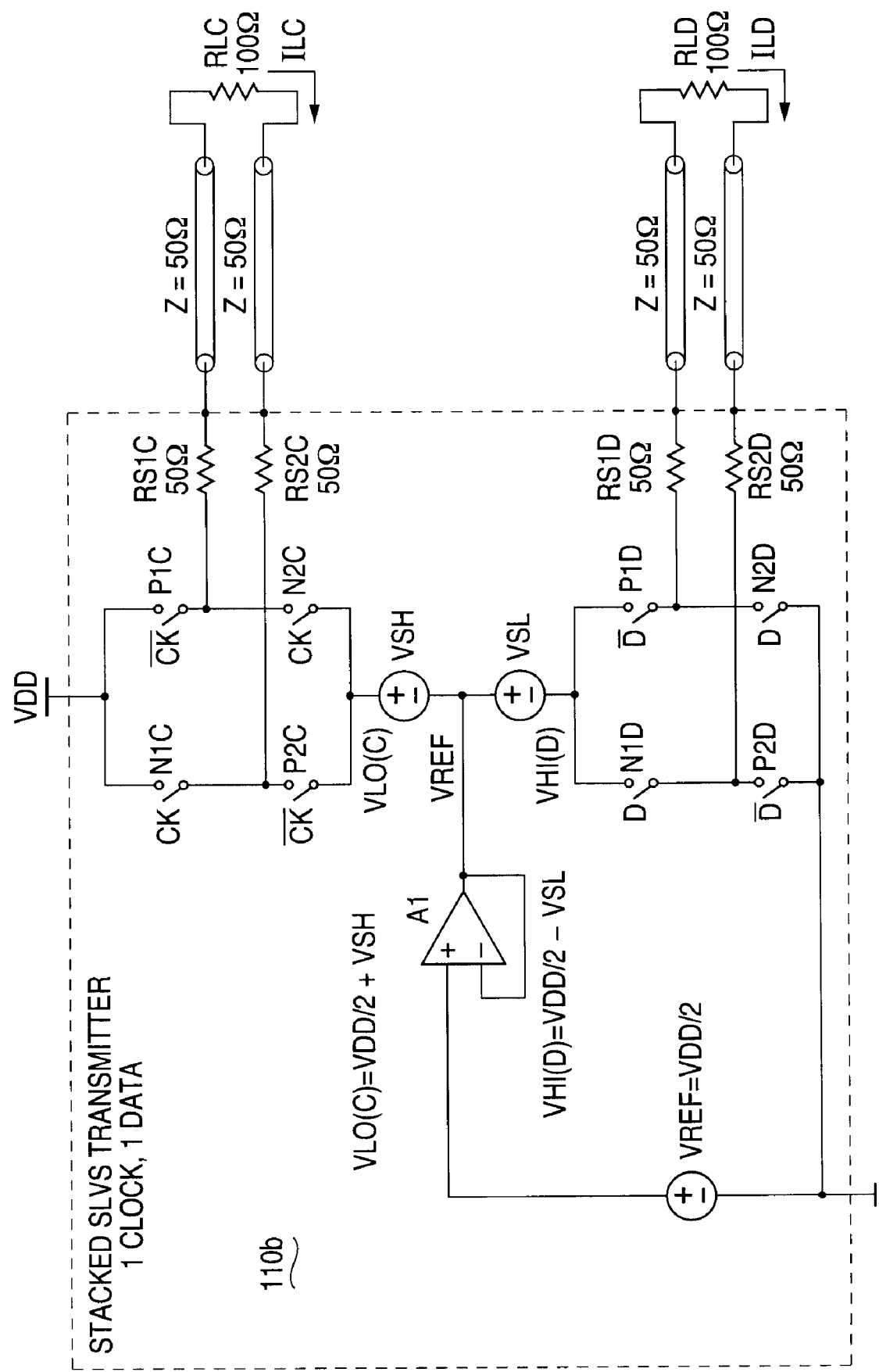
FIG. 5 is a schematic diagram of a stacked SLVS implementation of a differential signaling system in accordance with another embodiment of the presently claimed invention.

Referring to FIG. 5, SLVS transmitters can also be stacked in accordance with the presently claimed invention. As is well known, SLVS transmitters use switches having controlled impedances, with their switching current set by regulated pseudo supply voltage sources VSH, VSL. In this implementation 110b, as with the LVDS implementation 110a, a voltage regulator with a controlled voltage source VREF provides a regulated voltage which is buffered by a voltage follower amplifier A1 to provide the voltage VREF at the low impedance node between the floating voltage sources VSH, VSL. In integrated circuit applications, ideal floating voltage sources VSH, VSL can be difficult, if not impossible, to actually implement on-chip. However, alternate configurations with similar properties can be used.

Figure 6:
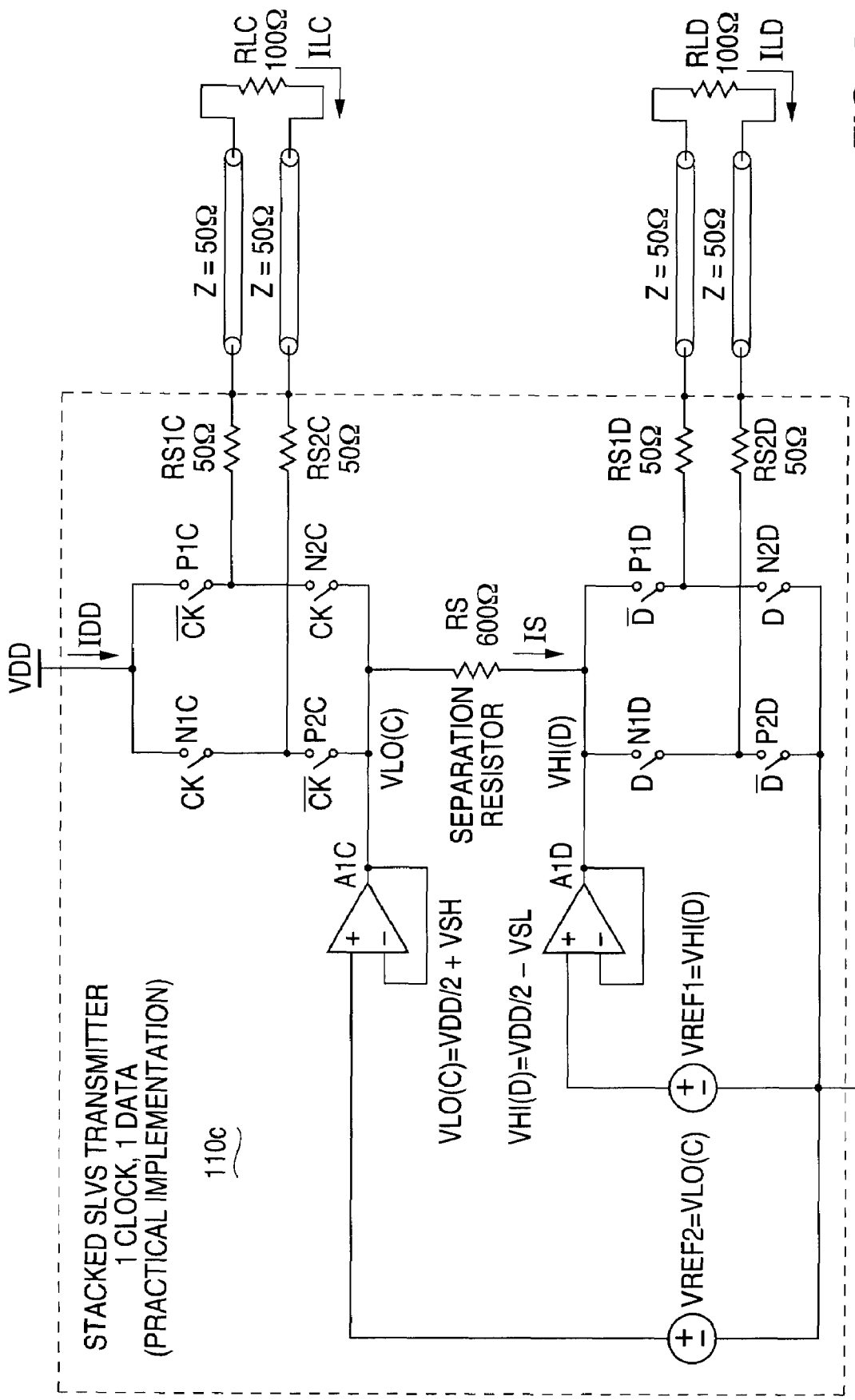
FIG. 6 is a schematic diagram of another SLVS implementation of a differential signaling system in accordance with another embodiment of the presently claimed invention.

Referring to FIG. 6, an SLVS transmitter 110c uses such an alternate configuration in the form of a separation resistance RS connected between the bottom electrode of the upper transmitter circuit and the top electrode of the lower transmitter circuit, as shown. In this implementation, two reference voltage sources VREF1, VREF2 provide the needed reference voltages which are buffered by voltage follower amplifiers A1C, A1D to provide the reference voltages VLOC, VHID at the low impedance nodes. The separation resistance RS needs only to be high enough in value to provide a sufficient voltage drop between these voltages VLOC, VHID and stabilize the signaling current at the desired level.

The voltage regulators, as described above, can be thought of as acting as "shock absorbers" inasmuch as they provide necessary current to or shunt excess current from the low impedance nodes between the stacked transmitters, thereby keeping them isolated during active transitions within the signal interfaces. Such excess current, i.e., current that exceeds the signaling current, can be controlled to be much less than the actual signaling current, e.g., by an order of magnitude. An alternative implementation can include a voltage regulator that provides low output impedances across the differential output electrodes, with the common mode voltage at the output of the regulator being controlled via a separate control loop. Such an implementation can be particularly advantageous for applications where the voltage difference between the bottom of one stacked transmitter and the top of its lower neighbor transmitter is sufficiently small to allow a simple implementation of such a fully differential regulator.

Figure 7A:
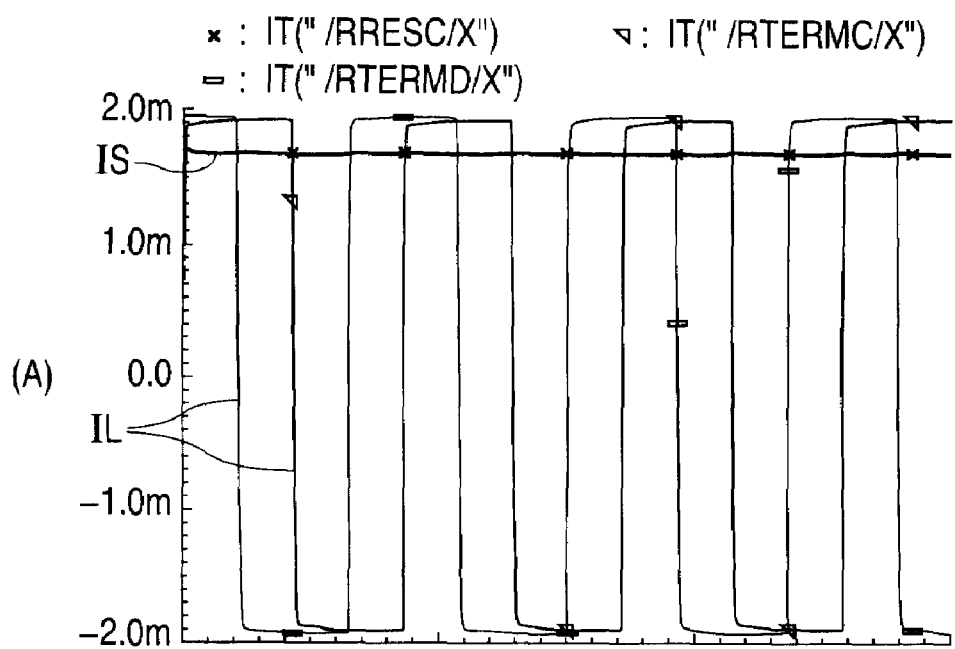
FIG. 7 illustrates a signal waveforms for simulated operation of the circuit of FIG. 6.
Figure 7B:
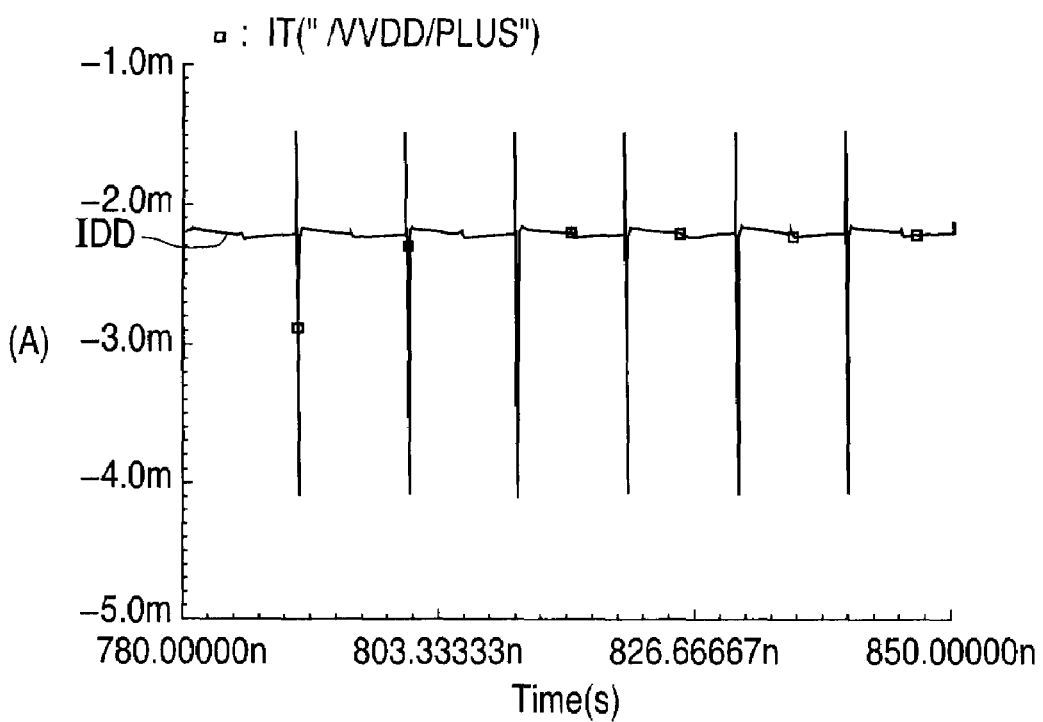
Figure 7C:
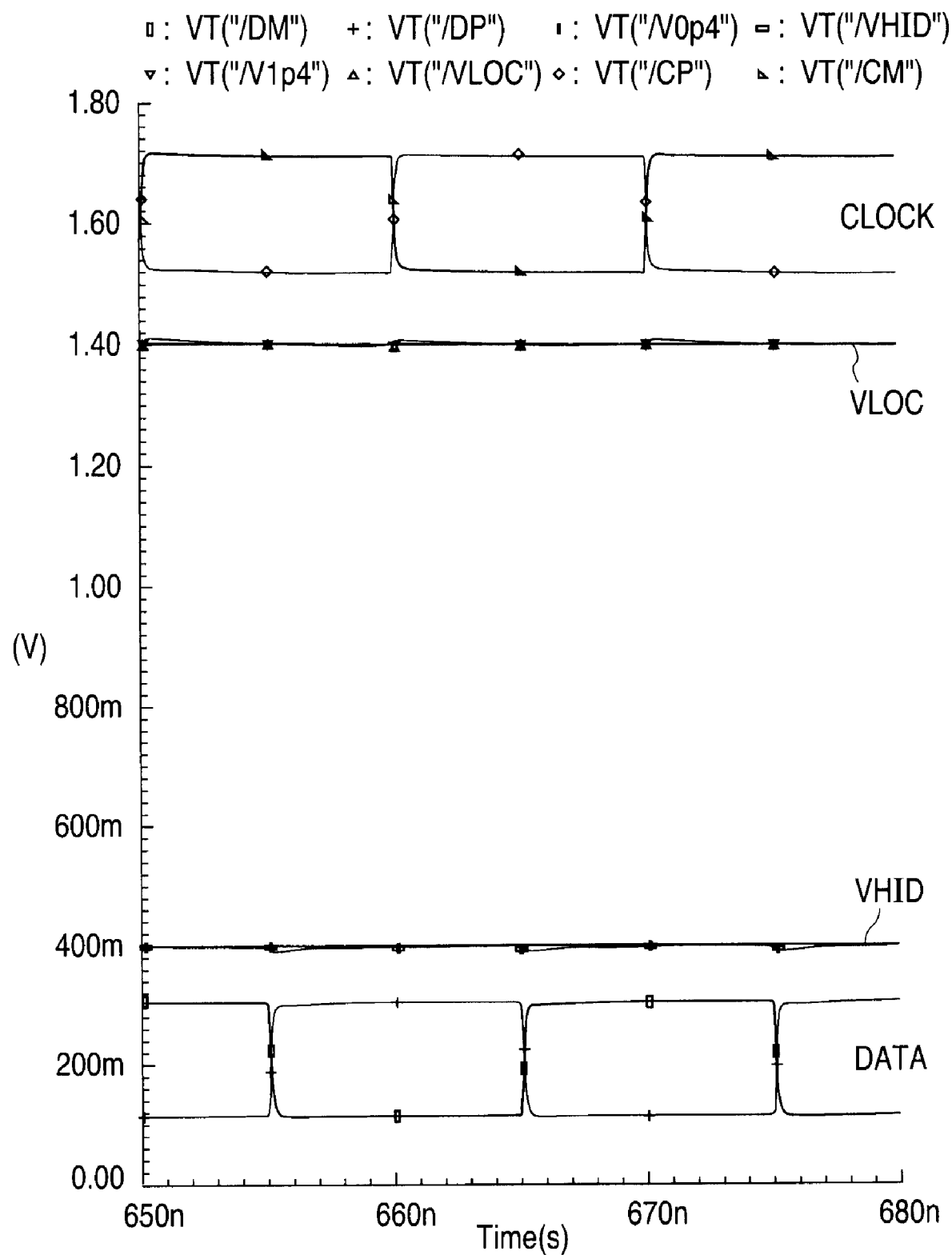

Referring to FIG. 7, simulations of clock and data signals transmitted in quadrature at a 50 MHz rate (100 MB/s) resulted in the waveforms as shown. The waveforms on the right are voltage waveforms at the outputs of the stacked transmitters and voltages VLOC, VHID at the low impedance nodes, as discussed above. The regulated voltage levels for voltages VLOC and VHID are set at 400 mV and 1.4 V, respectively, with a power supply voltage VDD of 1.8 V. Waveforms at the upper left are the current waveforms through the termination resistances RL and the separation resistance RS, which was 600 ohms for this example (which is larger than the required separation resistance value of 500 ohms). As can be seen, the current IS through the separation resistance RS is less than the signaling current IL. This is due to the excess current being sunk and sourced by the low dropout (LDO) voltage regulators providing the intermediate voltages VLOC, VHID. The total consumed current, i.e., the power supply current IDD, is shown in the lower left waveform and, with the exception of the AC switching currents, the nominal DC value is approximately 2.3 mA, which is significantly less than the typical 4 mA or more that would be consumed if the link was implemented with two separate SLVS signal channels.

Figure 8B:
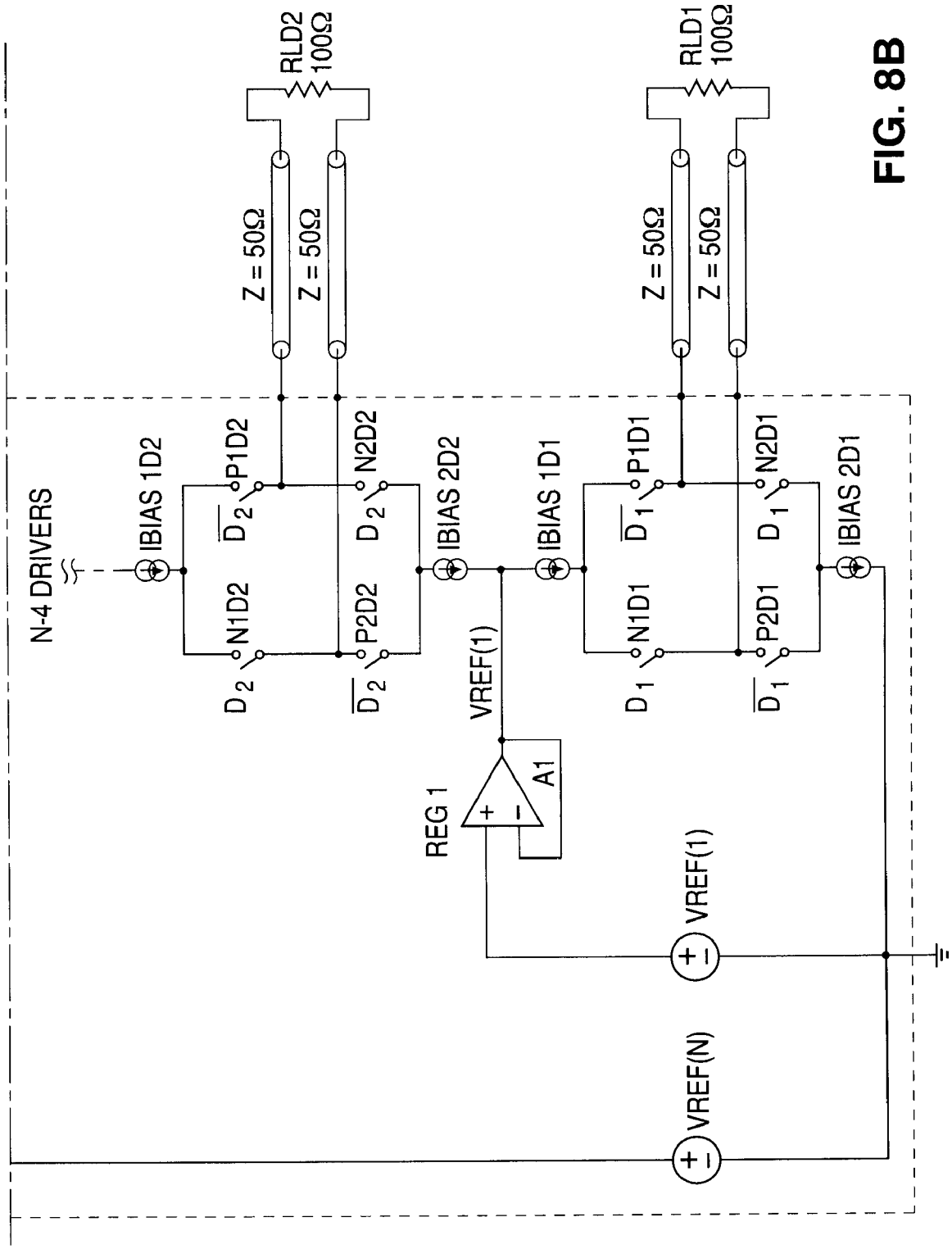
FIG. 8 is a schematic diagram of a stacked LVDS transmission system in accordance with another embodiment of the presently claimed invention.
Figure 9A:
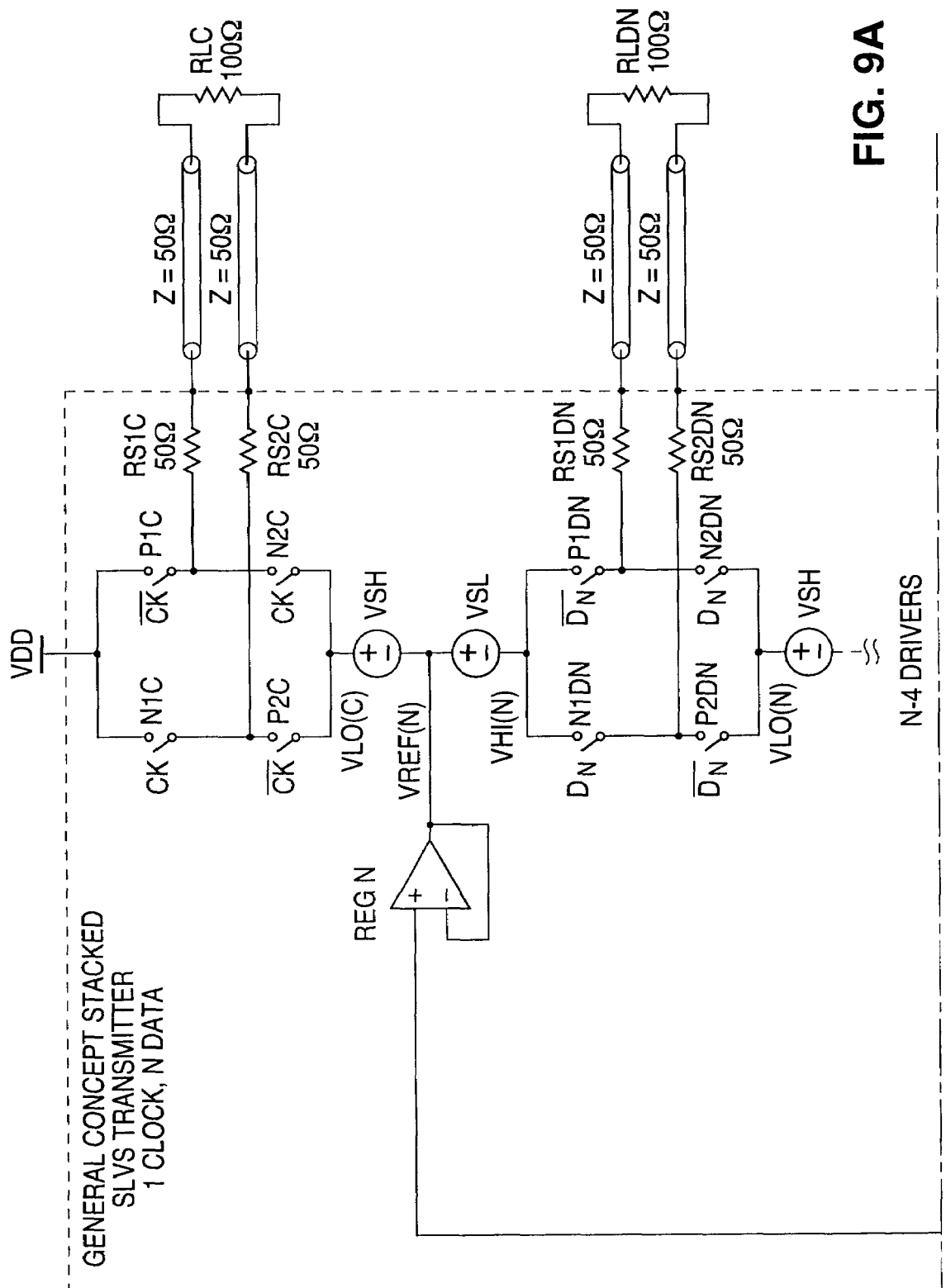
FIG. 9 is a schematic diagram of a stacked SLVS transmission system in accordance with another embodiment of the presently claimed invention.
Figure 9B:
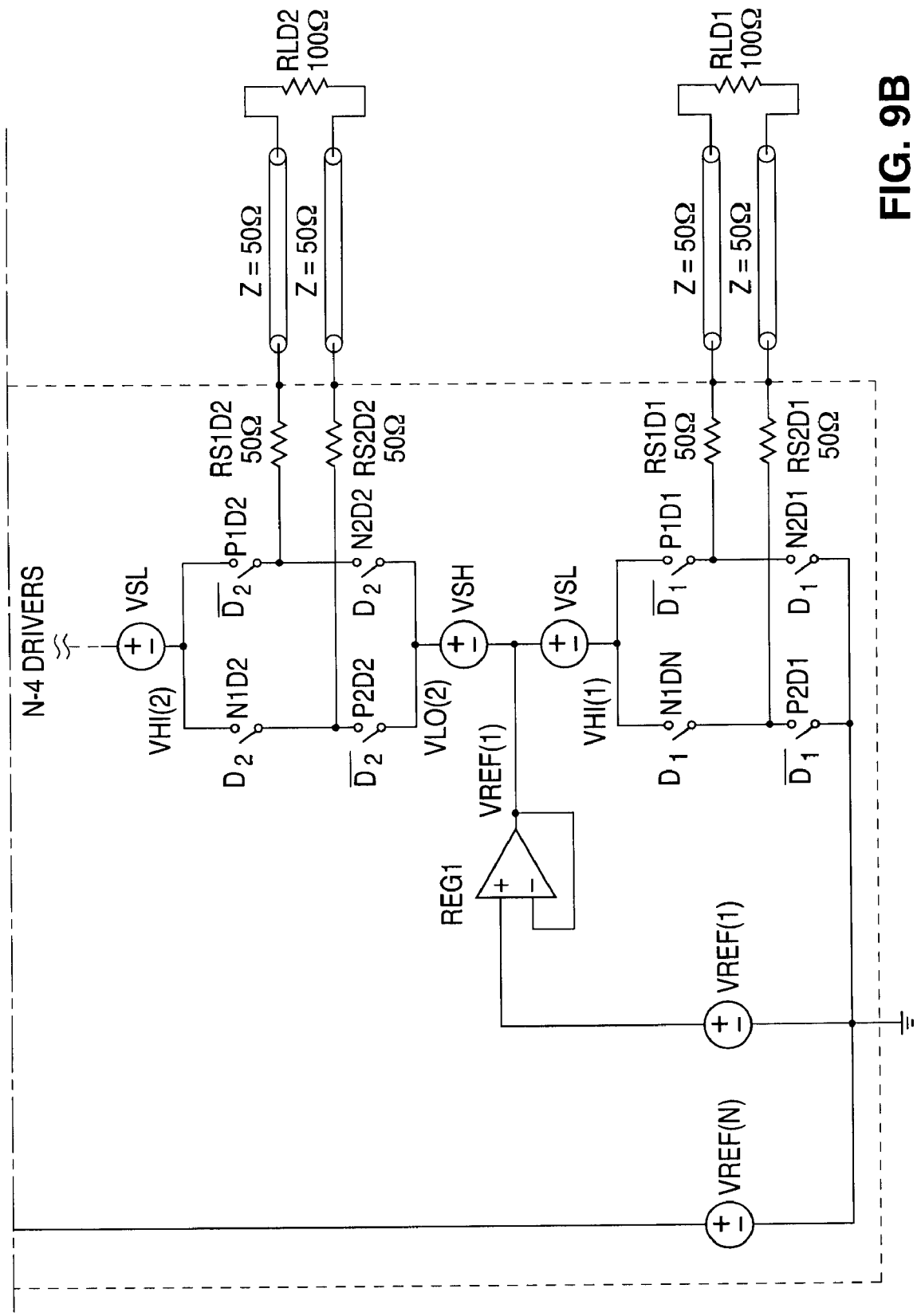

Referring to FIGS. 8 and 9, the stacking of differential transmitters in accordance with the presently claimed invention, can be expanded to larger numbers of transmitters. As should be readily understood by one of ordinary skill in the art, depending upon the magnitudes of the differential signals, an optimal number of data channels may be found to provide minimal power consumption.

Based upon the foregoing, it can be seen that a serial data link can now include multiple signal channels, each with a differential signal having a fixed magnitude and a different output common mode voltage level. This allows the corresponding receiver circuit design to be simplified for minimal power dissipation. In a conventional LVDS receiver, the input common mode voltage can be anywhere within the specified power supply voltage range, and even beyond such range due to ground shift differentials. This can place significant design constraints on the receiver whose signal gain must be relatively constant within the wide input common mode voltage range to maintain good signal integrity.

When using the stacked transmitter designs, as discussed above, the transmitted output common mode voltages can be limited to a well controlled narrow range, thereby allowing the transmitter design to be simplified. For example, in the case of one clock channel and two data channels, each of the data channel transmitters can be placed near a respective one of the power supply voltages VDD, VSS, while the clock channel transmitter is placed in the middle of the stack. In a SLVS implementation, this will limit the data channel common mode output voltages to 200 mV and VDD-200 mV for a 2 mA signaling current. The common mode voltage of the clock channel can be fixed at half of the power supply voltage VDD/2. Accordingly, the receivers for the data channels can be implemented using only one type of differential pair devices, i.e., PMOS transistors for the receiver referenced to the lower power supply terminal VSS, and NMOS transistors for the receiver reference to the upper power supply terminal VDD. The clock channel receiver can be implemented in a traditional differential arrangement of PMOS and NMOS transistors.

Various other modifications and alternations in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including differential signal transmission circuitry with a plurality of stacked differential signal transmitters, comprising:
    first and second power supply electrodes to provide first and second voltages;
    a plurality of differential signal transmission circuits coupled between said first and second power supply electrodes;
    one or more inner biasing circuits coupled among said plurality of differential signal transmission circuits;
    voltage regulation circuitry, coupled to at least one of said first and second power supply electrodes and to said one or more inner biasing circuits, to provide one or more regulator voltages having one or more successive values intermediate said first and second voltages;
    wherein
        said plurality of differential signal transmission circuits and said one or more inner biasing circuits are coupled in a stacked alternating relationship with a respective one of said one or more inner biasing circuits coupled between successive ones of said plurality of differential signal transmission circuits, and
        each one of said one or more inner biasing circuits is coupled to said voltage regulation circuitry to receive at least one respective one of said one or more regulator voltages.

2. The apparatus of claim 1, wherein said plurality of differential signal transmission circuits comprises a plurality of low voltage differential signal (LVDS) transmission circuits.

3. The apparatus of claim 2, wherein each one of said plurality of LVDS transmission circuits comprises a plurality of circuit branches mutually coupled in parallel each of which includes a respective plurality of transistors of opposite conductivity type mutually coupled in series.

4. The apparatus of claim 2, wherein each one of said one or more inner biasing circuits comprises respective current source circuitry.

5. The apparatus of claim 2, further comprising:
    a first outer biasing circuit coupled between said first power supply electrode and a first one of said plurality of differential signal transmission circuits; and
    a second outer biasing circuit coupled between said second power supply electrode and a last one of said plurality of differential signal transmission circuits.

6. The apparatus of claim 5, wherein said first and second outer biasing circuits comprises first and second current source circuitry.

7. The apparatus of claim 1, wherein said plurality of differential signal transmission circuits comprises a plurality of scalable low voltage serial (SLVS) transmission circuits.

8. The apparatus of claim 7, wherein each one of said plurality of SLVS transmission circuits comprises a plurality of circuit branches mutually coupled in parallel each of which includes a respective plurality of transistors of opposite conductivity type mutually coupled in series.

9. The apparatus of claim 7, wherein each one of said one or more inner biasing circuits comprises respective voltage source circuitry.

10. The apparatus of claim 7, wherein each one of said one or more inner biasing circuits comprises a respective resistive circuit.

11. The apparatus of claim 1, wherein each one of said plurality of differential signal transmission circuits comprises a plurality of circuit branches mutually coupled in parallel each of which includes a respective plurality of transistors of opposite conductivity type mutually coupled in series.

12. The apparatus of claim 1, further comprising:
    a first outer biasing circuit coupled between said first power supply electrode and a first one of said plurality of differential signal transmission circuits; and
    a second outer biasing circuit coupled between said second power supply electrode and a last one of said plurality of differential signal transmission circuits.

13. The apparatus of claim 12, wherein:
    each one of said one or more inner biasing circuits comprises respective current source circuitry; and
    said first and second outer biasing circuits comprises first and second current source circuitry.

14. The apparatus of claim 1, wherein said voltage regulation circuitry comprises one or more voltage regulator circuits each of which includes:
    a reference voltage source coupled to at least said one of said first and second power supply electrodes to provide a respective one of one or more reference voltages; and
    amplifier circuitry coupled between said reference voltage source and at least a respective one of said one or more inner biasing circuits, and responsive to said respective one of said one or more reference voltages by providing a respective one of said one or more regulator voltages.

15. An apparatus including differential signal transmission circuitry with a plurality of stacked differential signal transmitters, comprising:

first and second power supply electrodes to provide first and second voltages;

one or more shared electrodes;

a plurality of low voltage differential signal (LVDS) transmission circuits coupled via said one or more shared electrodes in a stacked relationship between said first and second power supply electrodes; and voltage regulation circuitry, coupled to at least one of said first and second power supply electrodes and to said one or more shared electrodes, to provide one or more regulator voltages having one or more successive values intermediate said first and second voltages;

wherein each one of said plurality of LVDS transmission circuits includes
 upper current source circuitry,
 lower current source circuitry, and
 a plurality of circuit branches mutually coupled in parallel and between said upper and lower current source circuitries, wherein each of said plurality of circuit branches includes a respective plurality of transistors of opposite conductivity type mutually coupled in series.

16. The apparatus of claim 15, wherein said voltage regulation circuitry comprises one or more voltage regulator circuits each of which includes:

a reference voltage source: coupled to at least said one of said first and second power supply electrodes to provide a respective one of one or more reference voltages; and amplifier circuitry coupled between said reference voltage source and at least a respective one of said one or more shared electrodes, and responsive to said respective one of said one or more reference voltages by providing a respective one of said one or more regulator voltages.

* * * * *

UNITED STATES PATENT AND TRADEMARK OFFICE
CERTIFICATE OF CORRECTION

PATENT NO. : 7,683,673 B2 Page 1 of 1
APPLICATION NO. : 11/753163
DATED : March 23, 2010
INVENTOR(S) : David J. Fensore et al.

It is certified that error appears in the above-identified patent and that said Letters Patent is hereby corrected as shown below:

Claim 16, Column 10, Line 8

Please delete "a reference voltage source: coupled to..."
and insert -- ...a reference voltage source coupled to -- in its place.

Signed and Sealed this

Fourth Day of May, 2010

David J. Kappos
*Director of the United States Patent and Trademark Office*